United States Patent
Schmalz et al.

(10) Patent No.: US 10,228,407 B2
(45) Date of Patent: *Mar. 12, 2019

(54) ARC FAULT CIRCUIT INTERRUPTER DETECTOR SYSTEMS INCLUDING SUPER REGENERATIVE HIGH FREQUENCY RECEIVER

(71) Applicant: EATON INTELLIGENT POWER LIMITED, Dublin (IE)

(72) Inventors: Steven Christopher Schmalz, Franklin, WI (US); David Lee McClanahan, Greenfield, WI (US); Charles John Luebke, Hartland, WI (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 16/049,932

(22) Filed: Jul. 31, 2018

(65) Prior Publication Data

US 2018/0335464 A1 Nov. 22, 2018

Related U.S. Application Data

(63) Continuation of application No. 15/075,463, filed on Mar. 21, 2016, now Pat. No. 10,060,964.

(51) Int. Cl.
*H02H 1/00* (2006.01)
*H02H 3/16* (2006.01)
*G01R 31/02* (2006.01)

(52) U.S. Cl.
CPC ......... *G01R 31/025* (2013.01); *H02H 1/0015* (2013.01); *H02H 3/16* (2013.01)

(58) Field of Classification Search
CPC ............. H02H 3/16; H02H 3/162; H02H 3/33
USPC ..................................... 361/42–50
See application file for complete search history.

(56) References Cited

U.S. PATENT DOCUMENTS

| | | |
|---|---|---|
| 5,223,795 A | 6/1993 | Blades |
| 5,224,006 A | 6/1993 | MacKenzie et al. |
| 5,434,509 A | 7/1995 | Blades |
| 5,452,223 A | 9/1995 | Zuercher et al. |
| 5,561,605 A | 10/1996 | Zuercher et al. |
| 5,590,012 A | 12/1996 | Dollar, II |
| 5,691,869 A | 11/1997 | Engel et al. |
| 5,706,159 A | 1/1998 | Dollar, II et al. |

(Continued)

*Primary Examiner* — Dharti H Patel
(74) *Attorney, Agent, or Firm* — Eckert Seamans

(57) ABSTRACT

An arc fault circuit interrupter detector circuit including a super regenerative high frequency receiver is described herein. In one exemplary, non-limiting embodiment, a current measure component determines that a current noise signal within a circuit breaker is occurring at a particular frequency of interest. The super regenerative high frequency receiver receives the current noise signal and, via an oscillator circuit, causes the signal to ramp to a quench voltage, dissipate, and repeat. A microcontroller in communication with the super regenerative high frequency receiver measures a time period of the oscillator circuit's oscillations, and determines an amplitude of the current noise signal based, at least in part, on the time period. If it is determined that the amplitude of the input current signal at the frequency of interest corresponds to an arc fault event, a trip signal is generated to trip the circuit, quenching the arc fault event.

20 Claims, 10 Drawing Sheets

(56) References Cited

U.S. PATENT DOCUMENTS

| | | | |
|---|---|---|---|
| 5,729,145 | A | 3/1998 | Blades |
| 5,933,305 | A | 8/1999 | Schmalz et al. |
| 6,088,205 | A | 7/2000 | Neiger et al. |
| 6,128,169 | A | 10/2000 | Neiger et al. |
| 6,522,228 | B2 | 2/2003 | Wellner et al. |
| 6,522,509 | B1 | 2/2003 | Engel et al. |
| 6,542,056 | B2 | 4/2003 | Nerstrom et al. |
| 6,594,125 | B2 | 7/2003 | Dollar, II |
| 6,633,824 | B2 | 10/2003 | Dollar, II |
| 6,710,688 | B2 | 3/2004 | Wellner et al. |
| 6,859,042 | B2 | 2/2005 | Parker |
| 8,089,737 | B2 | 1/2012 | Parker et al. |
| 2005/0286184 | A1 | 12/2005 | Campolo |
| 2009/0040665 | A1 | 2/2009 | Elms et al. |
| 2017/0269139 | A1* | 9/2017 | Schmalz .............. G01R 31/025 |

* cited by examiner

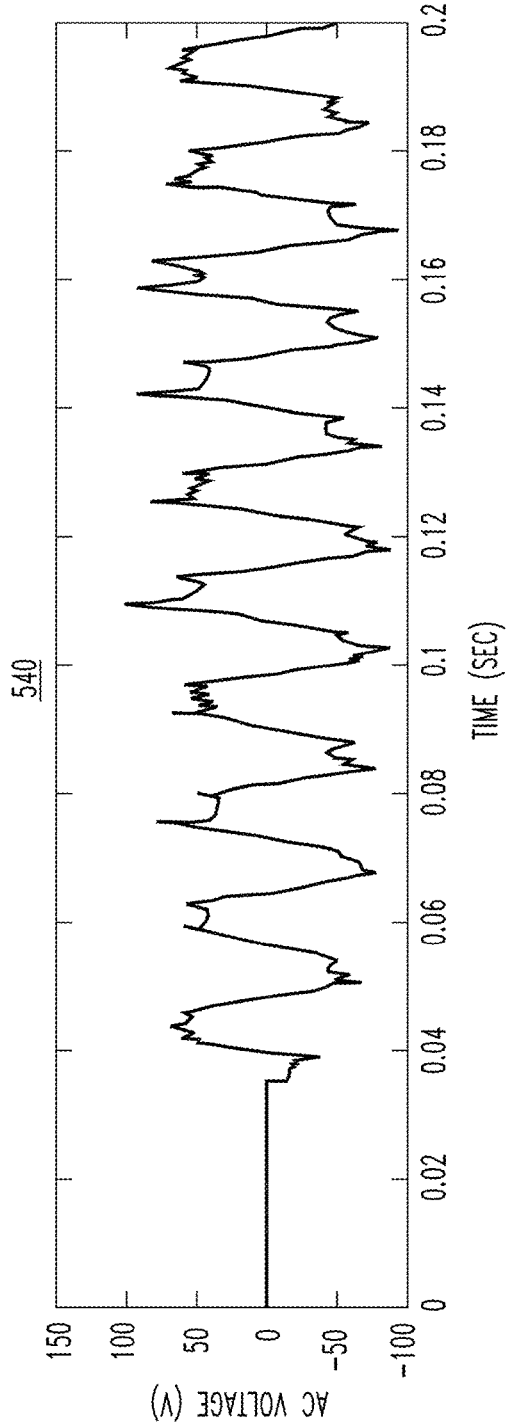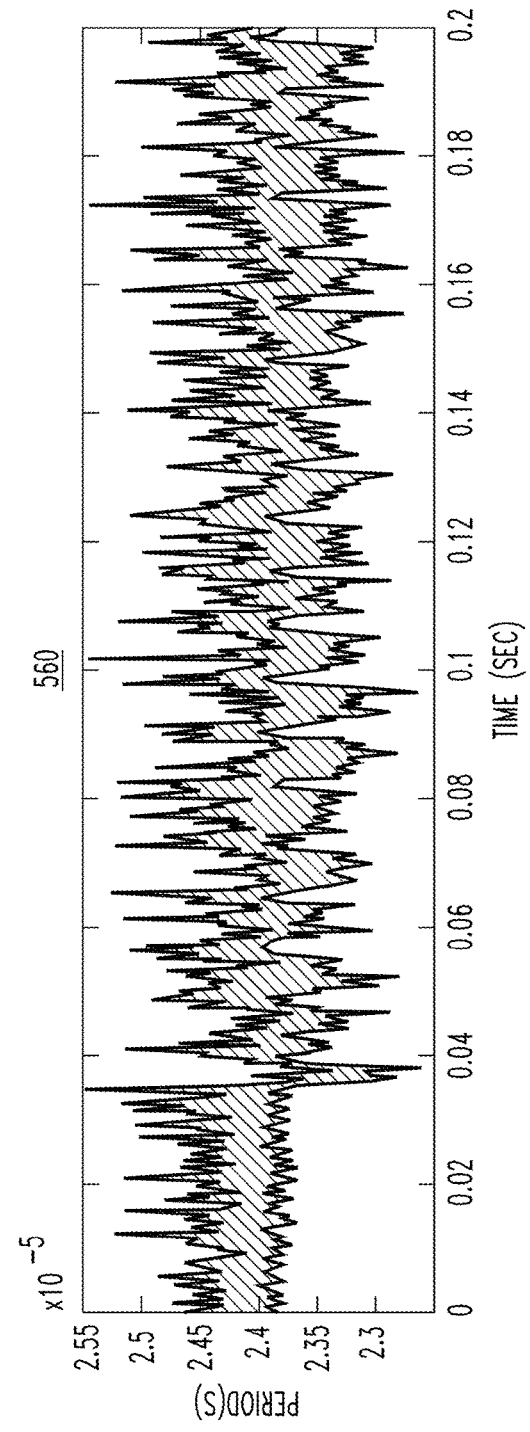

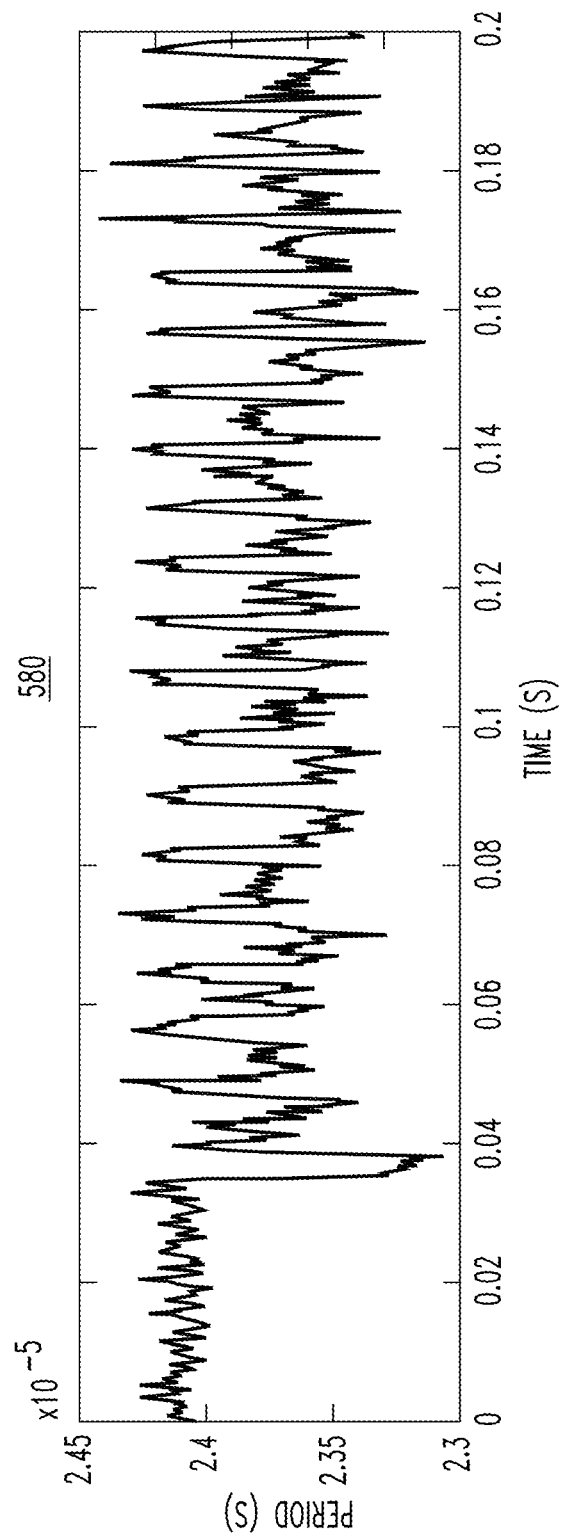

ARC FAULT CIRCUIT INTERRUPTER DETECTOR SYSTEMS INCLUDING SUPER REGENERATIVE HIGH FREQUENCY RECEIVER

CROSS-REFERENCE TO RELATED APPLICATION

This application is a continuation of, and claims priority under 35 U.S.C. § 120 from, U.S. patent application Ser. No. 15/075,463, filed Mar. 23, 2016, entitled "ARC FAULT CIRCUIT INTERRUPTER DETECTOR SYSTEMS INCLUDING SUPER REGENERATIVE HIGH FREQUENCY RECEIVER", the contents of which are incorporated herein by reference.

BACKGROUND

Field

The disclosed concept relates generally to an arc fault circuit interrupter detector system including one or more super regenerative high frequency receivers and, more particularly, to super regenerative high frequency receivers that monitor and detect arc fault events. The disclosed concept also relates generally to methods for detecting arc fault events using an arc fault circuit interrupter detector system including a super regenerative high frequency receiver.

Background Information

Circuit breakers are used to protect electrical circuitry from damage due to an overcurrent condition, such as an overload condition or a relatively high level short circuit or fault condition. In small circuit breakers, commonly referred to as miniature circuit breakers such as those typically used for residential and light commercial applications, such protection is typically provided by a thermal-magnetic trip device. This trip device includes a bimetal, which heats and bends in response to a persistent overcurrent condition. The bimetal, in turn, unlatches a spring powered operating mechanism, which opens separable contacts of the circuit breaker to interrupt current flow in the protected power system.

An arc fault circuit interrupter ("AFCI") is a device intended to mitigate the effects of arc faults by functioning to deenergize an electrical circuit when an arc fault is detected. Non-limiting examples of AFCIs include, but are not limited to, arc fault circuit breakers, branch/feeder arc fault circuit interrupters, outlet circuit arc fault circuit interrupters, cord arc fault circuit interrupters, combination arc fault circuit interrupters, and portable arc fault circuit interrupters. During sporadic arc fault events, the overload capabilities of a conventional circuit breaker will not function since the root-mean-squared ("RMS") value of the fault current is too small to active the automatic magnetic trip circuit. The addition of electronic arc fault sensing to a circuit breaker can add one of the elements needed for sputtering arc fault protection. In this scenario, the output of an electronic arc fault sensing circuit directly trips and, therefore, opens the circuit breaker. This concept is described in greater detail within commonly assigned U.S. Pat. Nos. 6,710,688, which issued on Mar. 23, 2004; 6,542,056, which issued on Apr. 1, 2003; 6,522,509, which issued on Feb. 18, 2003; 6,522,228, which issued on Feb. 18, 2003; 5,691,869, which issued on Nov. 25, 1997; and U.S. Pat. No. 5,224,006, which issued on Jun. 29, 1993, each of which is incorporated herein by reference in their entirety.

Arc faults within distribution wiring or other power distribution systems can be of both the safe and unsafe series arc type. For example, a safe series arc may occur in commutator brushes of direct current ("DC") and universal motors. To minimize brush heating and erosion, universal motors are formed to minimize the net duration and thereby the total energy dissipated by commutation arcing. As another example, an unsafe arc, may occur through a combination of random processes that produce unintended series arcs. The unsafe series arc, therefore, may be extremely dangerous in distribution systems, as equipment and lives could be lost.

Many existing techniques for detecting arc fault events use reception and detection of high frequency electromagnetic noise emissions from arcing within distribution wirings or other power distribution system. One such arc fault detection technique is described in greater detail within commonly assigned U.S. Pat. No. 8,089,737, which issued on Jan. 3, 2012, and which is incorporated herein by reference in its entirety. For example, high frequency receivers may be employed within electronic circuitry to detect arc fault conditions. However, these high frequency receivers are generally expensive to manufacture as well as implement within circuit breakers and/or power distribution centers. This is further exacerbated if large numbers of high frequency receivers are used within arc fault detection devices such as AFCIs.

There is, therefore, room for improvement in arc fault circuit interrupters.

There is also room for improvement in methods for detecting arc fault events within power distribution systems.

SUMMARY

These needs and others are met by embodiments of the disclosed concept, which are directed to arc fault circuit interrupters or distribution wirings including super regenerative high frequency receivers. These needs and others are further met by embodiments of the disclosed concept which are directed to techniques for detecting arc fault events within distribution wirings including super regenerative high frequency receivers.

As one aspect of the disclosed concept, an arc fault circuit interrupter ("AFCI") detector system is provided. The AFCI detector system includes a current measure component that determines that a frequency of current corresponds to a frequency of interest. The AFCI detector system also includes at least one super regenerative high frequency receiver tuned to the frequency of interest. The at least one super regenerative high frequency receiver is structured to receive the current from the current measure component at the frequency of interest, provide the current to a tank circuit of the at least one super regenerative high frequency receiver, and determine a time period for oscillations within the at least one super regenerative high frequency receiver, the time period corresponding to consecutive occurrences of the current reaching a quench voltage within the tank circuit. The AFCI detector system further includes at least one microcontroller in communication with the at least one super regenerative high frequency receiver. The at least one microcontroller is structured to determine an amplitude of the current based on the time period, and determine that an arc fault event is occurring based, at least in part, on the amplitude of the current.

As another aspect of the disclosed concept, another AFCI detector system is provided. This AFCI detector system includes a plurality of super regenerative high frequency receivers that are each tuned to a different frequency of interest. Each super regenerative high frequency receiver is structured to receive current at the different frequency of interest corresponding to that super regenerative high frequency receiver, provide the current at the different frequency of interest to a tank circuit of the corresponding super regenerative high frequency receiver, and determine a time period for oscillations within the corresponding super regenerative high frequency receiver corresponding to consecutive occurrences of the current reaching a quench voltage for the tank circuit. The AFCI detector system also includes at least one microcontroller in communication with the plurality of super regenerative high frequency receivers. The at least one microcontroller is structured to determine an amplitude of the current based on the time period, and determine that an arc fault event is occurring based, at least in part, on the amplitude of the current.

As yet another aspect of the disclosed concept, a method is provided for determining that an arc fault event is present. Using a current measure component, a frequency of current within the circuit breaker is determined. Also using the current measure component, it is determined that the frequency of the current is at a frequency of interest of at least one super regenerative high frequency receiver. A tank circuit of the at least one super regenerative high frequency receiver receives the current such that the tank circuit causes the current to oscillate between a quench voltage and a baseline voltage. Using at least one microcontroller in communication with the at least one super regenerative high frequency receiver, an amplitude of the current at the frequency of interest within the circuit breaker is determined. Based at least in part on the amplitude of the current, it is determined that the arc fault event is present. A tripping signal is generated to trip a circuit breaker in response to determining that the arc fault event is present, and the tripping signal is sent to a tripping mechanism to interrupt the arc fault event.

BRIEF DESCRIPTION OF THE DRAWINGS

A full understanding of the disclosed concept can be gained from the following description of the preferred embodiments when read in conjunction with the accompanying drawings in which:

FIGS. 7A-E are illustrative graphs of line voltage, circuit current, voltage across an arcing sample, successive value of measured pulse time period, and a filtered measured pulse time period, respectively, in accordance with another embodiment of the disclosed concept.

DESCRIPTION OF THE PREFERRED EMBODIMENTS

Figure 1:
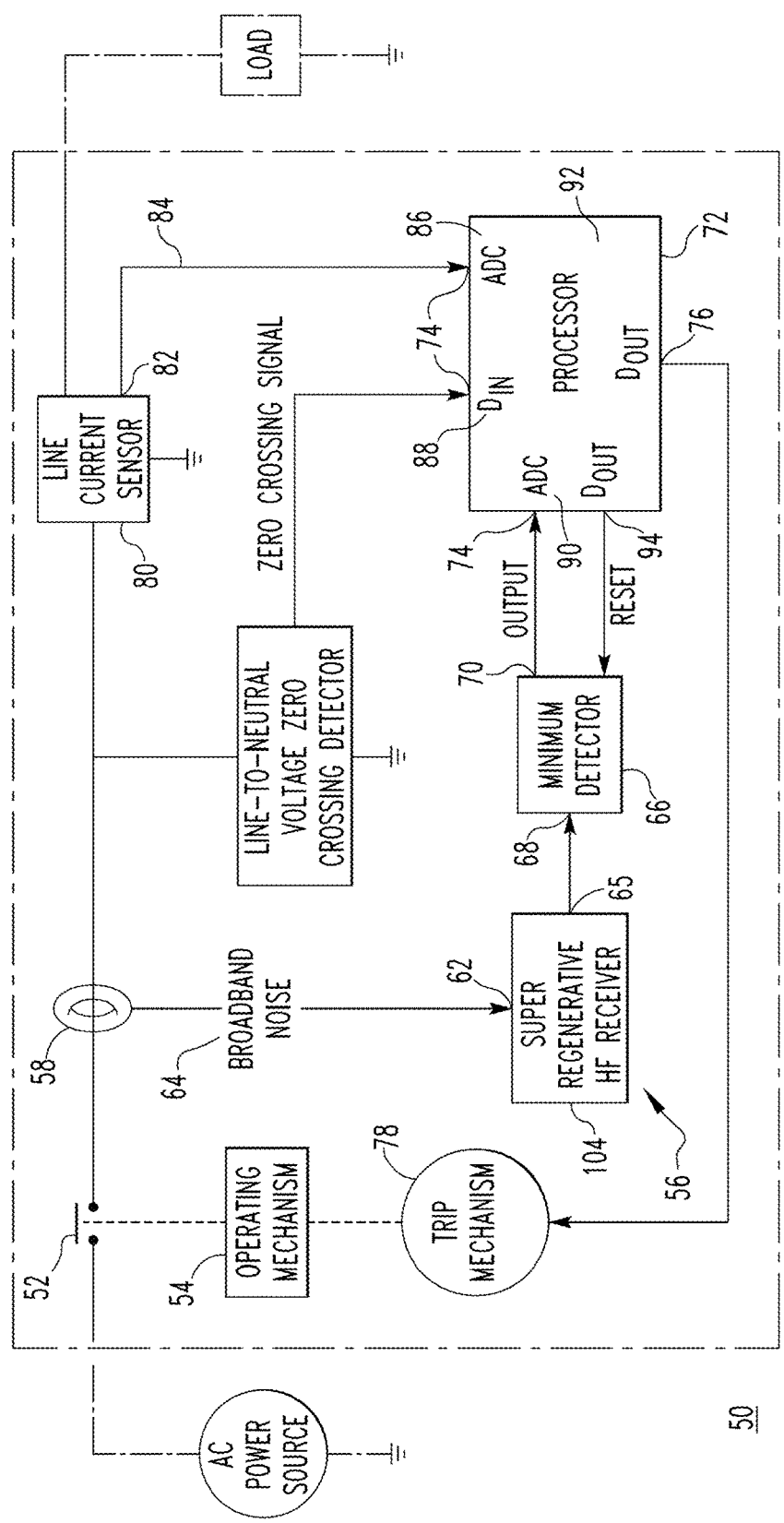
FIG. 1 is an illustrative schematic diagram of an arc fault circuit interrupter including a super regenerative high frequency receiver, in accordance with yet another embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

As employed herein, the term "number" shall mean one or an integer greater than one (i.e., a plurality).

As employed herein, the statement that two or more parts are "electrically coupled" or are in "electrical communication" shall mean that two or more the parts or components are joined together either directly or joined through one or more intermediate parts such that electricity, current, voltage, and/or energy is operable to flow from one part or component to the other part or component, and vice versa.

As employed herein, the term "processor" shall mean a programmable analog and/or digital device that can store, retrieve, and process data; a computer, a workstation; a personal computer; a microprocessor; a microcontroller; a microcomputer; a central processing unit; a mainframe computer; a mini-computer; a server; a networked processor; or any suitable processing device or apparatus.

As employed herein, the term "tuned current sensor" shall mean a current sensor (e.g., without limitation, a current transformer, a shunt, a Rogowski coil, a Hall Effect sensor) structured to sense broadband noise of a current at a predefined frequency or a predefined range of frequencies. Such predefined frequency or frequencies are substantially greater than a corresponding line frequency (e.g., without limitation, 60 Hz). The range of frequencies can, for example, be fixed or can be dynamically changed (e.g., without limitation, by a processor).

As employed herein, the term "dynamic range" shall mean the ratio or difference between the smallest and largest possible values of a changeable quantity (e.g., without limitation, amplitude; magnitude).

FIG. 1 is an illustrative schematic diagram of an arc fault circuit interrupter 50 including a super regenerative high frequency receiver 104, in accordance with yet another embodiment of the disclosed concept. Arc fault circuit interrupter ("AFCI") 50 of FIG. 1, in a non-limiting, exemplary embodiment includes separable contacts 52 and an operating mechanism 54 structured to open and close separable contacts 52. Also included within AFCI 50 is an arc fault circuit interrupter detector system 56 that is structured to detect arc fault events or arc fault conditions operatively associated with separable contacts 52. AFCI detector system 56, in one embodiment, includes a tuned current sensor 58 structured to sense broadband noise of current flowing through separable contacts 52. However, in another embodiment, current sensor 58 is not tuned to any specific frequency. For example, a line current sensor may, alternatively, be employed. AFCI detector system 56, in the exemplary embodiment, also includes one or more super regenerative high frequency receivers or detectors 104, including an input 62 for sensed broadband noise 64 from tuned current sensor 58, as well as an output 65. A minimum detector 66 of AFCI 50 includes an input 68 from output 65 of super regenerative high frequency detector(s) 104 and an output 70 of a minimum value of minimum detector input 68. Furthermore, in one embodiment, AFCI 50 includes a processor 72 that includes a number of inputs 74 and outputs 76, where one of inputs 74 is the minimum value output 70. Also included within AFCI 50, in one embodiment, is a trip mechanism 78 which cooperates with output(s) 76 of processor 72 and operating mechanism 54 to trip open separable contacts 52 in response to detecting an arc fault event across contacts 52.

A more detailed description of AFCI 50, as well as the components included therein, is provided within commonly-assigned U.S. Pat. No. 6,089,737, the disclosure of which is incorporated herein by reference in its entirety.

Figure 2A:
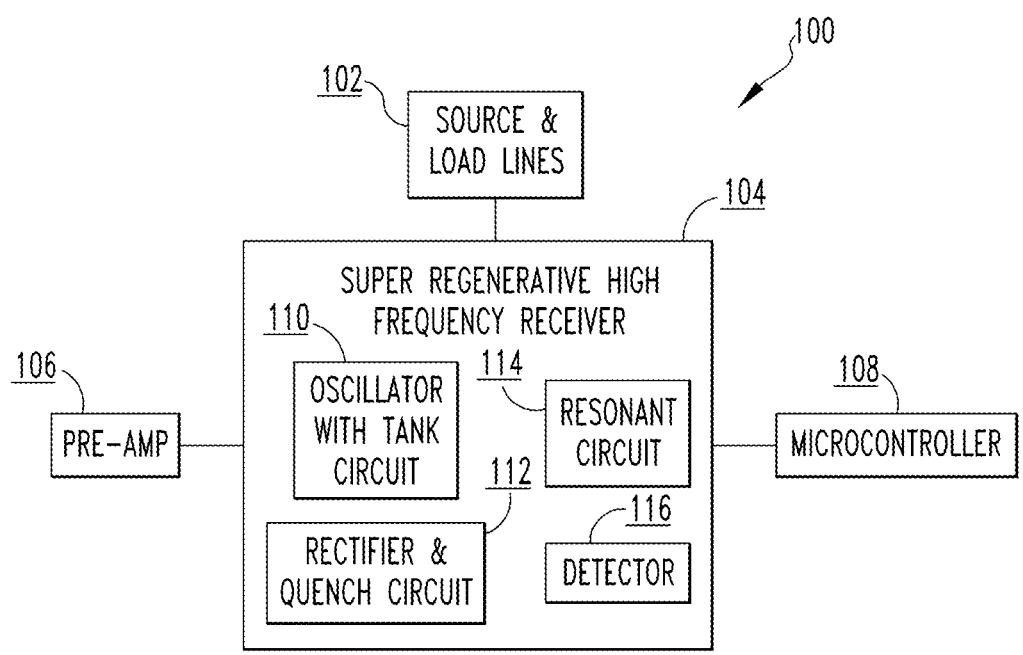
FIG. 2A is an illustrative block diagram of an arc fault circuit interrupter detector system including a super regenerative high frequency receiver in accordance with an embodiment of the disclosed concept.

FIG. 2A is an illustrative block diagram of an arc fault circuit interrupter detector system 100 including super regenerative high frequency receiver 104 in accordance with an embodiment of the disclosed concept. In the exemplary, non-limiting embodiment, AFCI detector system 100 includes a source and load lines block 102, which is in communication with super regenerative high frequency receiver 104. Source and load lines block 102 includes, for example, one or more of separable contacts 52, as described in FIG. 1, as well as one or more current measurement components, such as a shunt, current transformer, and/or Rogowski coil. Source and load lines block 102 is structured such that it receives broadband current noise from the circuit breaker or other power distribution system, measures an amount of current therein, as well as, or alternatively, determines a frequency of that current.

Super regenerative high frequency receiver 104 includes, in one exemplary embodiment, a resonant circuit 114, which is operably in communication with an oscillator 110 including a tank circuit. Oscillator 110, for example, may be tuned to a specific frequency, and is structured to modulate the incoming current signal such that the current signal repeatedly ramps and quenches itself. Super regenerative high frequency receiver 104 also includes an amplitude detector 112 including a quench circuit, as well as a detector circuit 116. Amplitude detector 112 is structured such that it ensures the oscillations of the current signal of oscillator 110 completely dissipates or fall below the level of the input current signal to be received. The detector circuit 116 is structured to receive the oscillation signal from oscillator 110 and modify the signal such that it is in a suitable format to be analyzed. In one embodiment, detector circuit 116 is not located within super regenerative high frequency receiver 104, and instead is in communication with super regenerative high frequency receiver 104. For example, detector circuit 116 may be external to super regenerative high frequency receiver 104 in an exemplary embodiment. Also included within system 100 is a pre-amp 106 and a microcontroller 108.

Pre-amp 106 is structured to isolate locale oscillator noise such that the local oscillator noise is inhibited from being injected back into super regenerative high frequency receiver 104 of other AFCI devices in the same power distribution system. In one embodiment, however, pre-amp 106 may also serve to isolate and enhance the input broadband current noise from source and load lines 102 in order to be more easily read and analyzed by super regenerative high frequency receiver 104. Persons of ordinary skill in the art will recognize, however, that the aforementioned description of pre-amp 106 is merely exemplary, and in one embodiment, multiple instances of pre-amp 106 may be employed, or pre-amp 106 may be removed from system 100 entirely. Microcontroller 108 is structured such that it receives a timer input signal from super regenerative high frequency receiver 104, and in particular, from detector circuit 116. Microcontroller 108, in the exemplary embodiment, is then further structured such that it monitors the input timer signals to determine whether or not the input broadband current signal from source and load lines 102 corresponds to an arc fault event. If, for example, microcontroller 108 determines that an arc fault event is present, microcontroller 108 is further structured to generate a trip signal for trip mechanism 78 to cause operating mechanism 54 to trip open separable contacts 52 to quench the arc fault event.

Figure 2B:
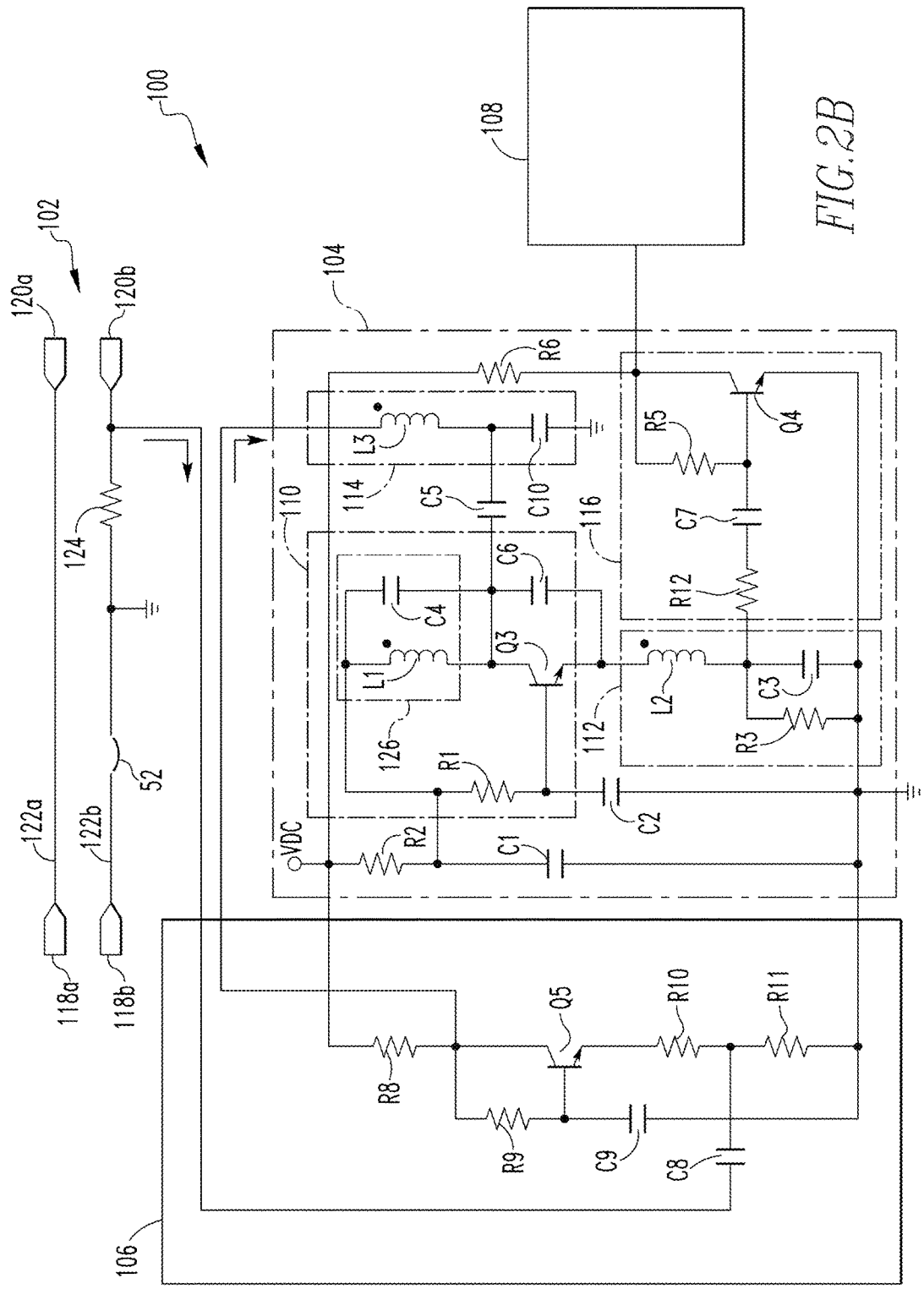
FIG. 2B is an illustrative schematic diagram of the system of FIG. 2A, in accordance with an embodiment of the disclosed concept.

FIG. 2B is an illustrative schematic diagram of the system of FIG. 2A, in accordance with an embodiment of the disclosed concept. As mentioned above, AFCI detector system 100 includes source and load line block 102, super regenerative high frequency receiver 104, pre-amp 106, and microcontroller 108. Persons of ordinary skill in the art will recognize, however, that although only one instance of each block is shown within both FIGS. 2A and 2B, this is merely for simplicity, and multiple instances of one or more of source and load line block 102, super regenerative high frequency receiver 104, pre-amp 106, and/or microcontroller 108 may be employed within system 100.

Source and load line block 102, in the exemplary embodiment, includes a neutral source conductor 118a, a line source conductor 118b, a load neutral conductor 120a, and a load line conductor 120b. For example, neutral source conductor 118a, line source conductor 118b, load neutral conductor 120a, and load line conductor 120b may be implemented within AFCI 50. Neutral source conductor 118a and neutral load conductor 120a, for example, operably communicate with one another over a line 122a, while line source conductor 118b and load line conductor operably communicate with one another over a line 122b. Line current within AFCI 50 passes through current breakers 52, which open on command (e.g., due to a trip signal), and then pass through a shunt 124. Shunt 124 is a low impedance current measure device that is structured to sense an amount, and a frequency of, current within a corresponding circuit breaker or power distribution system. Persons of ordinary skill in the art will recognize that shunt 124 may alternatively, or additionally, correspond to a current transformer or a Rogowski coil, and the aforementioned is merely exemplary. As current passes across shunt 124, voltage across shunt 124 is determined, thereby providing information regarding the current within the circuit breaker. In particular, high frequency noise in the form of current noise is converted by shunt 124 into a small voltage signal. In one embodiment, shunt 124 is tuned to a specific frequency of interest, or range of frequencies, with which arc fault events are expected or anticipated to occur. Shunt 124, in one embodiment, is structured such that it is sensitive to gain in order to amplify the gain for sensing and/or measuring the voltage across shunt 124.

Super regenerative high frequency receiver 104, as described previously, includes resonant circuit 114, oscillator 110, detector 116, and amplitude detector 112. Resonant circuit 114, as shown in the illustrative embodiment, includes an inductor L3 and a capacitor C10, which are operably connected to one another. Inductor L3 and capacitor C10 form resonant circuit 114, having a resonant frequency defined by Equation 1.

$$f = \frac{1}{2\pi\sqrt{LC}} \quad \text{Equation 1}$$

Inductor L3 and capacitor C10 are selected, in one embodiment, such that the resonant frequency, f, is substantially matched with the frequency of interest for shunt 124. In one embodiment, multiple inductors and capacitors are used to tune resonant circuit 114 such that it has a resonant frequency tuned to the frequency of interest of shunt 124, however, only a single instance of inductor L3 and capacitor C10 are provided for illustrative purposes. Furthermore, persons of ordinary skill in the art will recognize that additional components, such as one or more resistors, transistors, and/or diodes may also be included within resonant circuit 114, and the aforementioned is merely exemplary. Further still, persons of ordinary skill in the art will recognize that one or more of the aforementioned components may be omitted, without deviating from the spirit of the disclosed concept. For example, resonant circuit 114 may be omitted in another embodiment.

Resonant circuit 114 and oscillator 110 operatively communicate with one another via a capacitor C5, which serves to convey the input current signal at the frequency of interest from resonant circuit 114 to oscillator 110. Oscillator 110 includes, in the exemplary embodiment, a resonant tank circuit 126, which is structured to include an inductor L1 and a capacitor C4. Inductor L1 and capacitor C4 are tuned such that resonant tank circuit 126 resonates at the desired frequency of interest. Oscillator 110 further includes a capacitor C6, which is in series with capacitor C4, and a resistor R1, which is in parallel with tank circuit 126. Also included within oscillator 110 is a transistor Q3.

An incident signal at the frequency of interest starts oscillator 110, which may, for example, come from ambient background noise or an arc fault event within the distribution wiring (e.g., neutral source conductor 118a, line source conductor 118b, load neutral conductor 120a, and load line conductor 120b). The signal builds until a peak amplitude is reached at a quench voltage, at which point the oscillator circuit begins to quench itself. The time that the signal takes to build up to the peak prior to quenching is dependent on the amplitude of the incident signal. For instance, a large incident signal amplitude corresponds to a small amount of time for the signal to go from baseline to the quench voltage.

As tank circuit 126 resonates at the frequency of interest, the voltage across the parallel combination of inductor L1 and capacitor C4 will rise with increasing sinusoidal waveform amplitude at the collector of transistor Q3. During the negative excursions of the sinusoidal tank circuit voltage, capacitor C6 provides positive feedback and pulls the emitter voltage of transistor Q3 down, which in turn causes transistor Q3 to conduct, drawing current from the tank circuit 126 and thereby augmenting the build-up of oscillation amplitude. During this time, capacitor C6 discharges until the voltage is insufficient to keep transistor Q3 on and the augmented current draw ceases. As the sinusoidal voltage swings from decreasing to increasing, the base-to-emitter junction of transistor Q3 is reversed biased, holding the transistor off. During this period of increasing voltage, capacitor C6 is recharged through the components forming amplitude detector 112. During this period of increasing tank voltage, transistor Q3 provides no augmentation to the buildup of the oscillation voltage of tank circuit 126. Persons of ordinary skill in the art will recognize that the voltage continues to rise until it reaches a peak amplitude dictated by an amount of energy stored within the elements of tank circuit 126. After this occurs, the process, in one embodiment, repeats. Each subsequent oscillation results in a larger and larger voltage swing across tank circuit 126. Amplitude detector 112, in the exemplary embodiment, is structured to include an inductor L2 and a capacitor C3. Inductor L2 functionally averages the augmented current pulses from transistor Q3, which build proportionally with the amplitude of the oscillation voltage across tank circuit 126. The augmented current, therefore, charges capacitor C3. Amplitude detector 112, as an illustrative example, may be thought of as another oscillator structured to have a lower resonant frequency than that of tank circuit 126.

Capacitor C3 is eventually charged to such a high voltage that transistor Q3 is restricted from turning on and the current in inductor L2 reduces to zero, thereby preventing tank circuit 126 from receiving any feedback and the oscillations begin to dissipate, or quench. The values of capacitor C3 and a resistor R3 of amplitude detector 112 are structured such that the time constant associated with amplitude detector 112 is much slower than a time period for oscillations within tank circuit 126 to damp out on their own. Tank circuit 126 still oscillates, for example, but the oscillations taper off to a base level in a shorter period of time than it takes for the voltage on capacitor C3 to fall to a low enough voltage to again allow transistor Q3 to conduct. The discharge rate of capacitor C3 is, thus, limited by resistor R3. In order to ensure that transistor Q3 is turned off long enough to prevent restarting oscillations at a higher level than that of the incident signal, the time constant of amplitude detector circuit 112, as determined by the values of capacitor C3 and resistor R3, is selected to be of sufficient duration to assure dissipation of the oscillations of tank circuit 126, before allowing the oscillations to restart.

Detector circuit 116 is structured such that it includes a transistor Q4, a resistor R5, and a capacitor C7. Detector circuit 116 takes the pulse rate of the quenched oscillations from oscillator 110 and converts the signal to its digital squared pulse signal. By doing this, a measurable signal is obtained, which, as described in greater detail below, is capable of providing information regarding the amplitude of the incident signal. Persons of ordinary skill in the art will recognize that detector circuit 116 may be an additional component to super regenerative high frequency receiver 104, such that digital squared pulse signal is generated external to super regenerative high frequency receiver 104.

Furthermore, frequencies of interest, in one exemplary, non-limiting embodiment, correspond to frequencies ranging from 5 MHz to 20 MHz. In another exemplary embodiment, the frequencies of interest correspond to frequencies greater than 20 MHz, frequencies greater than 50 MHz, or any other suitable frequency range.

Super regenerative high frequency receiver 104, in one exemplary embodiment, also includes a pull up resistor R6, which is structured to pull the output signal high when transistor Q4 is not turned on (e.g., fully saturated). Pull up resistor R6 also is capable of biasing the current path for the incident signal. For example, if capacitor C7 discharges due to the base current of transistor Q4 when transistor Q4 is turned on fully (e.g., driven into saturation), during a pulse, resistor R6 provides a conduction path that enables recharging of capacitor C7 during the period between pulses such that the desired bias voltage at the base of transistor Q4 is restored.

Super regenerative high frequency receiver 104, in another exemplary embodiment, includes a capacitor C1 and a capacitor C2, which are bias capacitors structured to hold a direct current ("DC") reference voltage. The DC reference voltage held by capacitors C1 and C2, in one embodiment, are not effected by any high frequency oscillations from oscillator 110.

Pre-amp 106, in one exemplary embodiment, is structured to isolate and prevent oscillations of tank circuit 110 from returning back to the incident signal line as noise (e.g., at resonant circuit 114). In the exemplary embodiment, pre-amp 106 includes a resistor R8, a resistor R9, a resistor R10, and a resistor R11. Resistors R10 and R11, for example, may be in series with one another. Pre-amp 106 also includes a transistor Q5 in series with resistors R8 and R10 and R11, and in parallel with resistor R9 as well as a capacitor C9. Furthermore, a capacitor C8 conducts the incident signal from the voltage sensed across shunt 124.

As mentioned previously, the digital squared output signal from detector circuit 116 is received by microcontroller 108 to measure a time period for build-up of the oscillations within oscillator 110, and determine an amplitude of the incident current signal at the frequency of interest. In the exemplary embodiment, only a single microcontroller, microcontroller 108, is presented, however any number of microcontrollers may be employed within system 100. For example, a separate microcontroller for each different frequency of interest to be analyzed by system 100 may be used, or a single microcontroller structured to receive multiple signal inputs may be used. As another example, system 100 may include multiple super regenerative high frequency receivers 104, where each receiver 104 is tuned to a different frequency of interest. In this particular scenario, a corresponding microcontroller 108 may be employed to analyze an output signal from each super regenerative high frequency receiver 104.

In one exemplary embodiment, microcontroller 108 is structured to determine an amplitude of the incident high frequency current noise injected into super regenerative high frequency receiver 104. During operation, a small amount of noise in the circuit breaker can start tank circuit 110 such that oscillations begin, and a starting voltage of the oscillations can be determined. The oscillations ramp up until a quench voltage is reached, at which point the ramping stops and recedes to a baseline voltage, and then begins to ramp up again. During an arc fault event, the high frequency current noise injected into super regenerative high frequency receiver 104 is at a higher level than that due to the small noise in the circuit breaker, and the oscillations start occurring at a higher voltage level. This results in a shorter time period for the oscillations to build up to the quench voltage, subsequently quenching, returning to baseline, and repeating. Microcontroller 108, therefore, in the exemplary embodiment, is structured to measure the time periods between consecutive occurrences of the signal reaching the quench voltage. When the voltage at capacitor C3 is high enough, for example, corresponding to when quenching occurs, transistor Q4 turns on. The turning on of transistor Q4 is measured by microcontroller 108 as that time period is inversely and logarithmically proportional to the amplitude of the injected high frequency current noise. As an illustrative example, a short time period between the quench voltage being reached corresponds to a higher amplitude current signal, as opposed to a low amplitude current signal, which has a longer time period between the quench voltage being reached. For example, a large input signal amplitude of approximately—20 dBm, as referenced to a 50 Ohm input impedance, may correspond to a time period of approximately 28 microseconds, whereas a small input signal amplitude of approximately—70 dBm, as referenced to a 50 Ohm input impedance, may correspond to a time period of approximately 33 microseconds (at a substantially similar operating temperature).

Figure 3A:
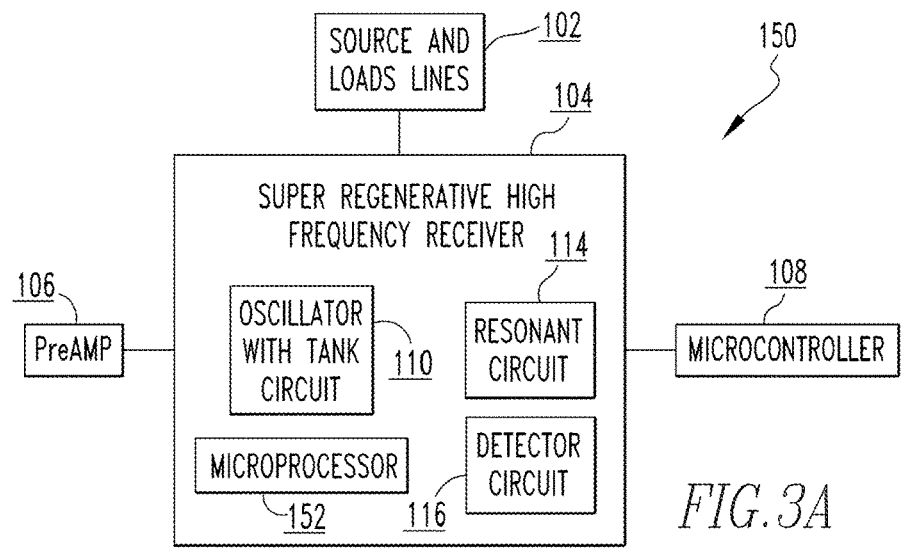
FIG. 3A is an illustrative block diagram of another arc fault circuit interrupter detector system including a super regenerative high frequency receiver in accordance with an embodiment of the disclosed concept.

FIG. 3A is an illustrative block diagram of another arc fault circuit interrupter detector system 150 including a super regenerative high frequency receiver in accordance with an embodiment of the disclosed concept. AFCI detector system 150, in the illustrative, non-limiting embodiment, is substantially similar to AFCI detector system 100 of FIG. 2A, with the exception that amplitude detector circuit 112 has been replaced with a microprocessor 152. Microprocessor 152, as described in greater detail below, is structured to allow oscillator circuit 110 to charge up and dissipate depending on a level of oscillations of oscillator 110. Although microprocessor 152 is shown as being a component of super regenerative high frequency receiver 104 of AFCI detector system 150, persons of ordinary skill in the art will recognize that microprocessor 152, in an alternative embodiment, may be located as a separate component external to super regenerative high frequency receiver 104.

Figure 3B:
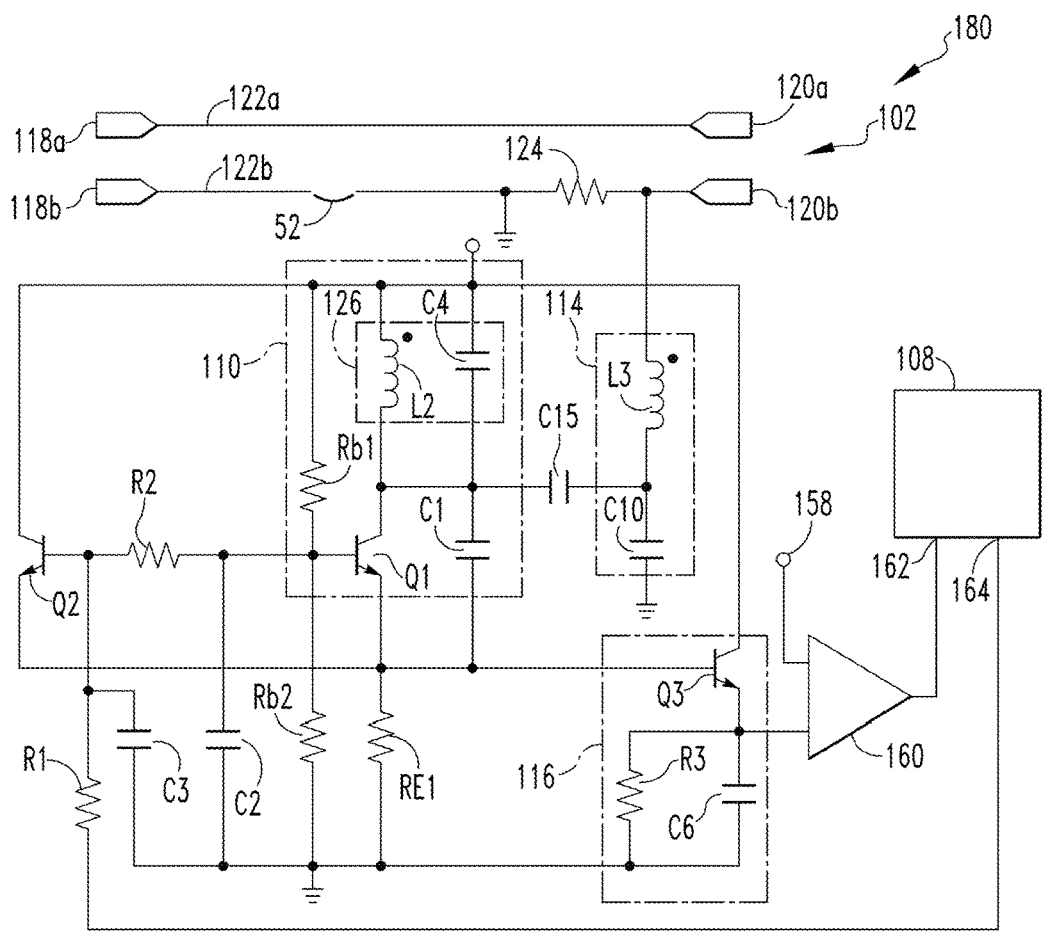
FIG. 3B is an illustrative schematic diagram of yet another arc fault circuit interrupter detector system including a super regenerative high frequency receiver, in accordance with an embodiment of the disclosed concept.
Figure 3C:
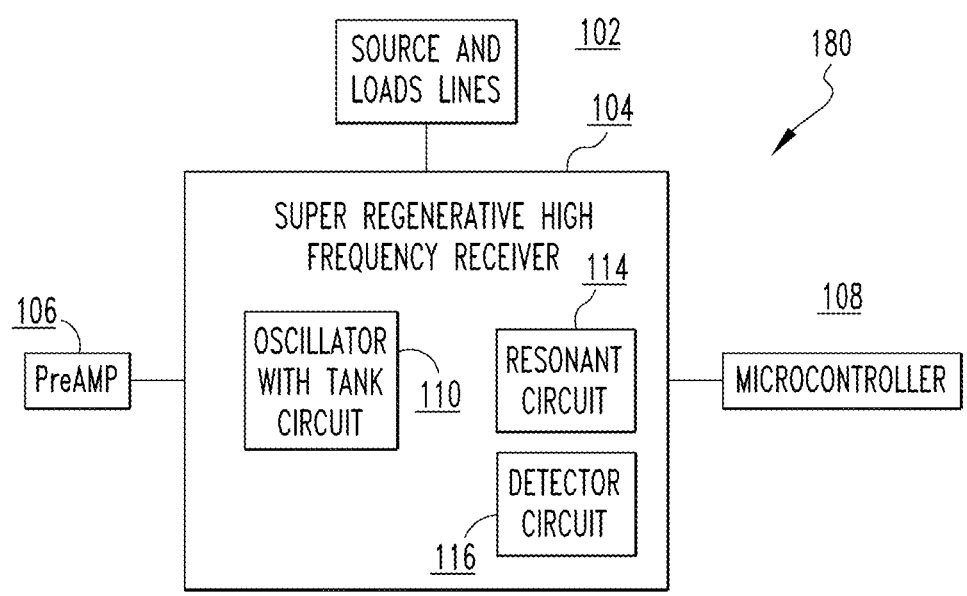
FIG. 3C is an illustrative block diagram of the system of FIG. 3B, in accordance with an embodiment of the disclosed concept.

FIG. 3C is an illustrative block diagram of yet another arc fault circuit interrupter detector system 180 including a super regenerative high frequency receiver, in accordance with an embodiment of the disclosed concept. AFCI detector system 180, in the illustrative, non-limiting embodiment, is substantially similar to detector systems 100 and 150, with the exception that the functionality of microprocessor 152 may be moved to microcontroller 108. This enables the overall component structure of AFCI detector system 180 to be minimized and simplified, as microcontroller 108 is capable of quenching oscillations from oscillator circuit 110, as well as reading time outputs from detector circuit 116. However, persons of ordinary skill in the art will recognize that microprocessor 152 may be located at any suitable position within detector system 180, and the aforementioned is merely exemplary. For instance, in one embodiment, microprocessor 152 is located external to both super regenerative high frequency receiver 104 and microcontroller 108, such that microprocessor 152 is still in communication with oscillator circuit 110.

FIG. 3B is an illustrative schematic diagram of the system of FIG. 3C, in accordance with an embodiment of the disclosed concept. As described previously, inductor L2, capacitors C4 and C1, and transistor Q1 form oscillator circuit 110. In the exemplary embodiment, a resistor Rb1, a resistor Rb2, and a capacitor C2 provide a bias voltage. A voltage across a resistor RE1, which in one embodiment is substantially similar to resistor R3 of AFCI detector system 100, is proportional to the oscillations of oscillator circuit 110.

A transistor Q2 is included within AFCI detector system 180, in the illustrative embodiment, which is biased similarly to transistor Q1, such that when the emitter of transistor Q2 is pulled to a high enough voltage, oscillations within oscillator circuit 110 are inhibited. In the illustrative embodiment, microcontroller 108 includes a voltage source 164 that provides a voltage capable of going from a logical high to a local low. When the output of voltage source 164 from microcontroller 108 is logically high, the bias voltage at a base of transistor Q2 is lifted slightly and turns on transistor Q2. The voltage on a common emitter between transistors Q1 and Q2 is therefore also lifted, and all of the current flowing through resistor RE1 goes through transistor Q2. Thus, no current will pass through transistor Q1, preventing transistor Q1 from turning on such that transistor Q1 cannot assist in promoting oscillations within oscillator 110, thereby causing the oscillations to dampen out and cease.

Transistors Q1 and Q2, in one embodiment, function as a differential pair. In other words, the emitters of transistors Q1 and Q2 are coupled together. For the differential pair with unequal base-to-emitter voltages, only a single transistor can be "on" at a time, and therefore if one of the transistor's emitters is at a high voltage, the other transistor turns off as that emitter is robbed of a current source (e.g., from resistor RE1).

To enable oscillations to begin within oscillator circuit 110, the voltage output from voltage source 164 of microcontroller 108 is set at ground, which gently pulls the bias voltage down on transistor Q2, thereby allowing current passing through resistor RE1 to be drawn from oscillator circuit 110 through transistor Q1. The voltage across resistor RE1 will build higher and higher with each swing of oscillator circuit 110. As the voltage at the base of transistor Q3 increases, the voltage at a capacitor C6 and a resistor R3 of detector circuit 116 also increases, until a threshold voltage is reached, indicating that it is time for quenching of the oscillations within oscillator circuit 110. A reference voltage 158 is provided to a voltage comparator 160 to compare with the voltage from transistor Q3. If the voltage from transistor Q3 is greater than or equal to reference voltage 158, a trigger to quench the oscillations is generated at a timer input 162 of microcontroller 108. In response, microcontroller 108 generates a quench signal 164 that returns a logic output (e.g., logic high) to transistor Q2, pulling up the voltage on transistor Q2 and turning off transistor Q1.

Transistor Q3, in one embodiment, indicates when the voltage of the oscillations within oscillator circuit 110 are at a high enough level to initiate quenching. Thus, transistor Q3 may, for example, act as a rectifier. However, persons of ordinary skill in the art will recognize that transistor Q3 may operate differently as compared to amplitude detector circuit 112 of FIG. 2B, because no resistor and/or capacitor based time constant is needed to allow dissipation of the oscillations of oscillator circuit 110. For every oscillation, the current across resistor RE1 swings in one direction, which causes transistor Q3 to build up voltage on capacitor C6 and resistor R3. An average voltage across resistor R3, which is then fed to capacitor C6, is then compared to the threshold voltage of voltage comparator 160. If the voltage exceeds the threshold voltage, signified by reference voltage 158, of voltage comparator 160, logic output 164 is sent transistor Q2 to cause the voltage output to be pulled to ground, causing the oscillations to stop.

Figure 4A:
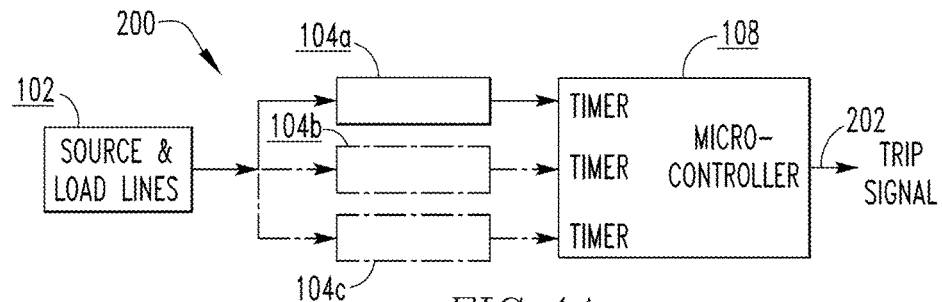
FIG. 4A is an illustrative block diagram of an arc fault circuit interrupter detector system including multiple super regenerative high frequency receivers, in accordance with another embodiment of the disclosed concept.

FIG. 4A is an illustrative block diagram of an arc fault circuit interrupter detector system 200 including multiple super regenerative high frequency receivers, in accordance with another embodiment of the disclosed concept. AFCI system 200, in one embodiment, is substantially similar to system 100 of FIGS. 2A and 2B, with the exception that AFCI system 200 includes multiple instances of super regenerative high frequency receiver 104, each of which is tuned to a different frequency of interest.

As an illustrative example, one or more shunts 124 or other current measuring components of sense and load lines 102 may be tuned to be sensitive to various frequencies of interest, or a range of frequencies. For instance, system 200 may be configured such that shunt 124 is sensitive to multiple frequencies of interest (e.g., $f_1$, $f_2$, $f_3$, etc.), or multiple shunts 124 may be employed that are each tuned to a different frequency of interest (e.g., a first shunt tuned to $f_1$, a second shunt tuned to $f_2$, a third shunt tuned to $f_3$, etc.). In either of these scenarios, multiple super regenerative high frequency receivers 104 are capable of being used to receive a corresponding incident current noise signal at a particular frequency of interest. For example, a super regenerative high frequency receiver 104a may be tuned such that inductor L3 and capacitor C10 of its resonant circuit 114, as well as inductor L1 and capacitor C4 of tank circuit 126, are tuned to a first frequency of interest $f_1$. Similarly, a super regenerative high frequency receiver 104b may, instead, be tuned such that inductor L3 and capacitor C10 of its resonant circuit 114, as well as inductor L1 and capacitor C4 of tank circuit 126, are tuned to a second frequency of interest $f_2$. Furthermore, super regenerative high frequency receiver 104c may be tuned such that inductor L3 and capacitor C10 of its resonant circuit 114, as well as inductor L1 and capacitor C4 of tank circuit 126, are tuned to a third frequency of interest $f_3$. Persons of ordinary skill in the art will recognize that any number of frequencies of interest, and therefore any number of super regenerative high frequency receivers 104 may be employed within system 200, and the use of three super regenerative high frequency receivers 104a-c is merely exemplary.

After each super regenerative high frequency receiver 104a-c has processed its corresponding incident current signal, a timer input from each of receiver 104a-c is received by microcontroller 108. The timer input, as mentioned previously, is used by microcontroller 108 to determine a time period between quenching of the oscillations from oscillator 110 of each of super regenerative high frequency receivers 104a-c. This time period is then analyzed by microcontroller 108 to determine an amplitude of each incident current signal received by each of super regenerative high frequency receivers 104a-c. If, for example, it is determined that one of super regenerative high frequency receivers 104a-c detects a current signal having the amplitude and frequency properties of an arc flash event, AFCI system 200 may cause a trip signal 202 to be generated and transmitted to trip mechanism 78 to trip the circuit breaker and quench the arc fault.

Figure 4B:
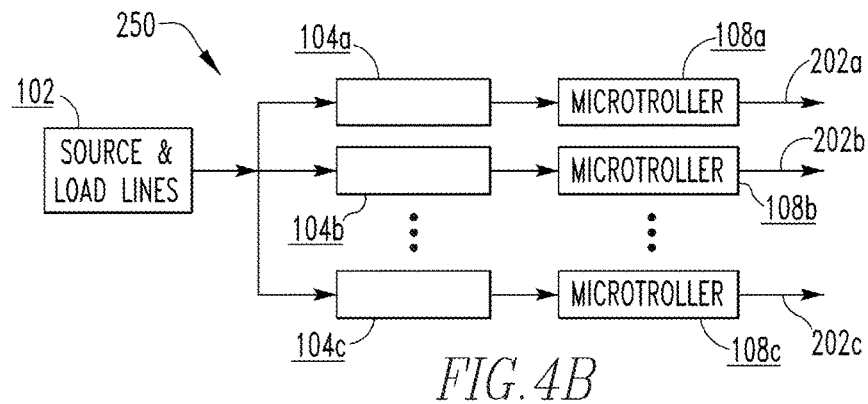
FIG. 4B is illustrative block diagram of another arc fault circuit interrupter detector system including multiple super regenerative high frequency receivers and multiple microcontrollers, in accordance with another embodiment of the disclosed concept.

FIG. 4B is illustrative block diagram of another arc fault circuit interrupter detector system 250 including multiple super regenerative high frequency receivers and multiple microcontrollers, in accordance with another embodiment of the disclosed concept. As described above with regards to FIG. 4A, arc fault circuit interrupter system 250 includes super regenerative high frequency receivers 104a-c, each of which is tuned to a different frequency of interest (e.g., frequencies $f_1$, $f_2$, and $f_3$). As opposed to system 200 of FIG. 4A, system 250 of FIG. 4B includes microcontrollers 108a-c, each of which is in communication with a respective one of super regenerative high frequency receivers 104a-c. For example, super regenerative high frequency receiver 104a, which is tuned to frequency of interest $f_1$, is in communication with a microcontroller 108a. If microcontroller 108a determines that super regenerative high frequency receiver 104a has detected an arc fault event at frequency $f_1$, microcontroller 108a is structured to generate a trip signal 202a to trip mechanism 78 to quench the arc fault event. Similarly, a super regenerative high frequency receiver 104b, which is tuned to frequency of interest $f_1$, is in communication with a microcontroller 108b. If microcontroller 108b determines that super regenerative high frequency receiver 104b has detected an arc fault event at frequency $f_1$, microcontroller 108b is structured to generate a trip signal 202b to trip mechanism 78 to quench the arc fault event. Furthermore, a super regenerative high frequency receiver 104c, which is tuned to frequency of interest $f_3$, is in communication with a microcontroller 108c. If microcontroller 108c determines that super regenerative high frequency receiver 104c has detected an arc fault event at frequency $f_3$, microcontroller 108c is structured to generate a trip signal 202c to trip mechanism 78 to quench the arc fault event.

Previous high frequency receivers were created using expensive components, making the use of high frequency receivers impractical and not cost effective. As mentioned above, super regenerative high frequency receiver 104 is capable of being manufactured using relatively inexpensive components (e.g., resistors, capacitors, inductors, transistors, etc.). The relatively cost-effective construction of super regenerative high frequency receiver 104 (and therefore receivers 104a-c) enables systems 200 and 250 to employ multiple super regenerative high frequency receivers 104a-c without severe financial strain. The super regenerative high frequency receivers, as described herein, for example, are extremely beneficial as they allow for multiple frequencies or frequency ranges to be monitored for arc fault events at a same time, as opposed to monitoring only a single frequency. Furthermore, the low-cost structure of super regenerative high frequency receiver 104 enables an individual to add additional super regenerative high frequency receivers 104, or replace defective or unnecessary receivers 104, without suffering any relative financial hardship.

Figure 5:
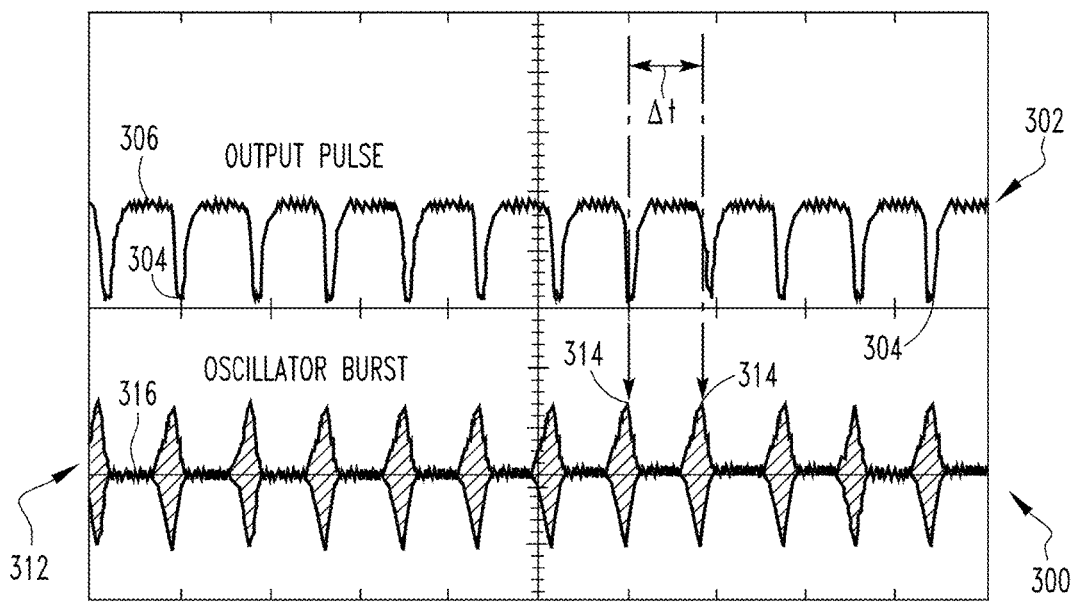
FIG. 5 is an illustrative graph of an output signal and an oscillator signal from the AFCI detector system of FIGS. 2A, 2B, 3A, 3B, and/or 3C, in accordance with an embodiment of the disclosed concept.

FIG. 5 is an illustrative graph 300 of an output signal and an oscillator signal from the AFCI detector system of FIGS. 2A and/or 2B, in accordance with an embodiment of the disclosed concept. Graph 300 of FIG. 5 includes two wave form plots 302 and 312. Waveform plot 302, in the exemplary embodiment, corresponds to an output pulse from detector circuit 116, whereas waveform plot 312 corresponds to the oscillator voltage from oscillator 110. As seen from waveform plot 302, the output pulse goes low at points 304, corresponding to each time oscillator circuit 110 begins to be quenched. The logical pulse then goes high at point 306, corresponding to when oscillations within oscillator circuit 110 are allowed to build up again.

In one embodiment, microcontroller 108 receives output pulse 302 and measures a time period $\Delta t$, or an amount of time, between corresponding points 304. Each of points 304, for instance, corresponds to a point of time when the signal within oscillator 110 reaches the quench voltage, as seen at points 314 of waveform plot 312. As the signal within oscillator 110 builds up, the oscillator voltage within waveform plot 312 builds up, until it reaches the quench voltage, and which point the signal quenches and returns to a baseline level 316. The time period $\Delta t$ between consecutive peaks (e.g., consecutive occurrences of quench point 314) is inversely logarithmically proportional to an amplitude of the incident noise current signal at the specified frequency of interest for super regenerative high frequency receiver 104. Thus, the smaller time period $\Delta t$ is, the larger the amplitude of the incident noise current signal is. In one embodiment, microcontroller 108, as described above, is structured to measure time period $\Delta t$ and convert the time period into an amplitude reading. This enables microcontroller 108 to determine whether or not the incident noise current signal at the frequency of interest corresponds to an arc fault event and, if so, generate and send a trip signal 202 to trip mechanism 78 to quench the arc fault event.

Figure 6:
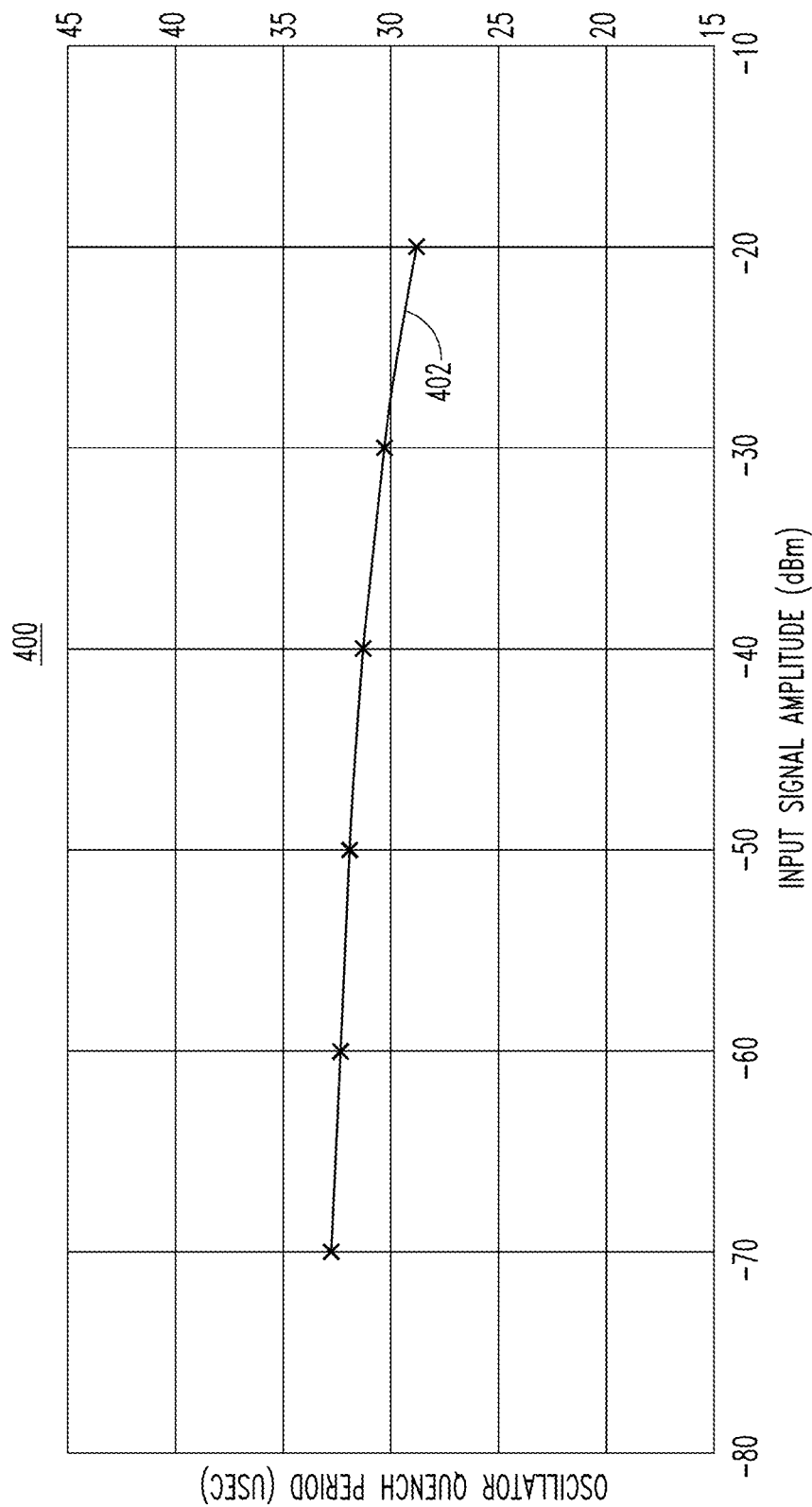
FIG. 6 is an illustrative graph of the relationship of gain and input signal amplitude for the exemplary AFCI detector systems of FIGS. 2A, 2B, 3A, 3B, and/or 3C, in accordance with an embodiment of the disclosed concept.

FIG. 6 is an illustrative graph 400 of the relationship of gain and input signal amplitude for exemplary AFCI detector system 100 of FIGS. 2A and/or 2B, in accordance with an embodiment of the disclosed concept. Graph 400 of FIG. 6, in one exemplary embodiment, describes the relationship of an input signal's amplitude for AFCI system 100, 200, 250 and a time period, $\Delta t$, for quenching to occur of super regenerative high frequency receiver 104. Graph 400 includes line 402 corresponding to the behavior of time period $\Delta t$ for oscillations within oscillator circuit 110 of super regenerative high frequency receiver 104 based on an incident amplitude of a noise current signal at a frequency of interest.

A line 402, in one embodiment, corresponds to time period $\Delta t$ versus input signal amplitude. The relationship between time period $\Delta t$ and the input signal amplitude is fairly consistent, as shown by line 402. For example, the gain is substantially log-linear with respect to the input signal's amplitude.

FIGS. 7A-E are illustrative graphs of line voltage, circuit current, voltage across an arcing sample, successive value of measured pulse time period, and a filtered measured pulse time period, respectively, in accordance with another embodiment of the disclosed concept. Graphs 500, 520, 540, 560, and 580 of FIGS. 7A-E, respectively, correspond to various plots for a 5 Amp Carbonized Path Arc test per UL 1699 procedures. In the exemplary embodiment, arcing is initiated at approximately 35 milliseconds.

Figure 7A:
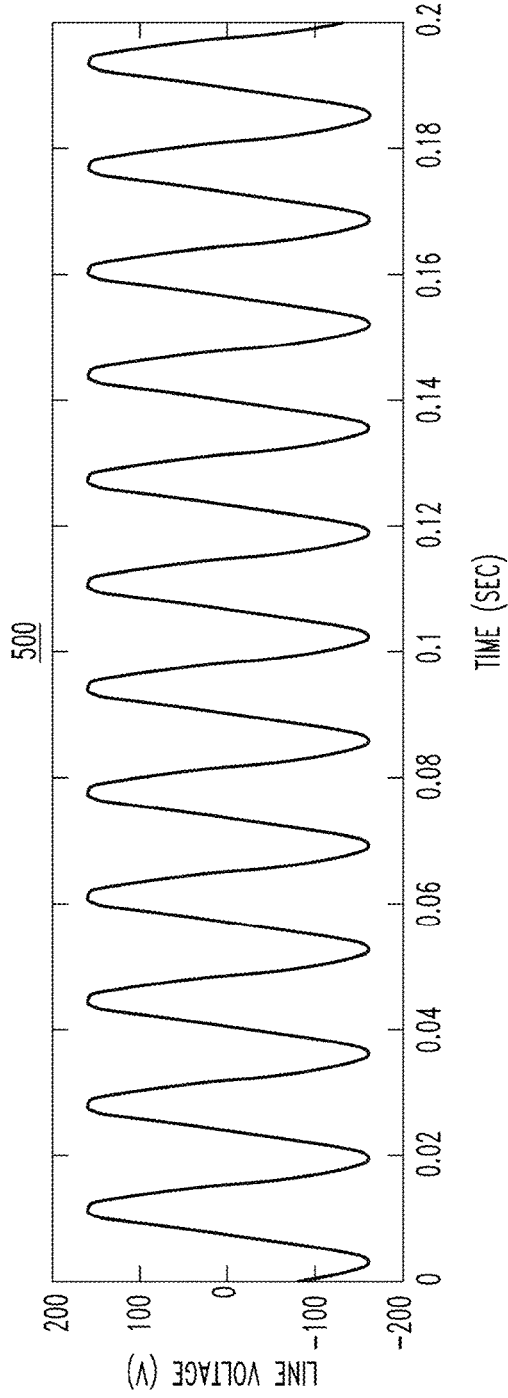
Figure 7B:
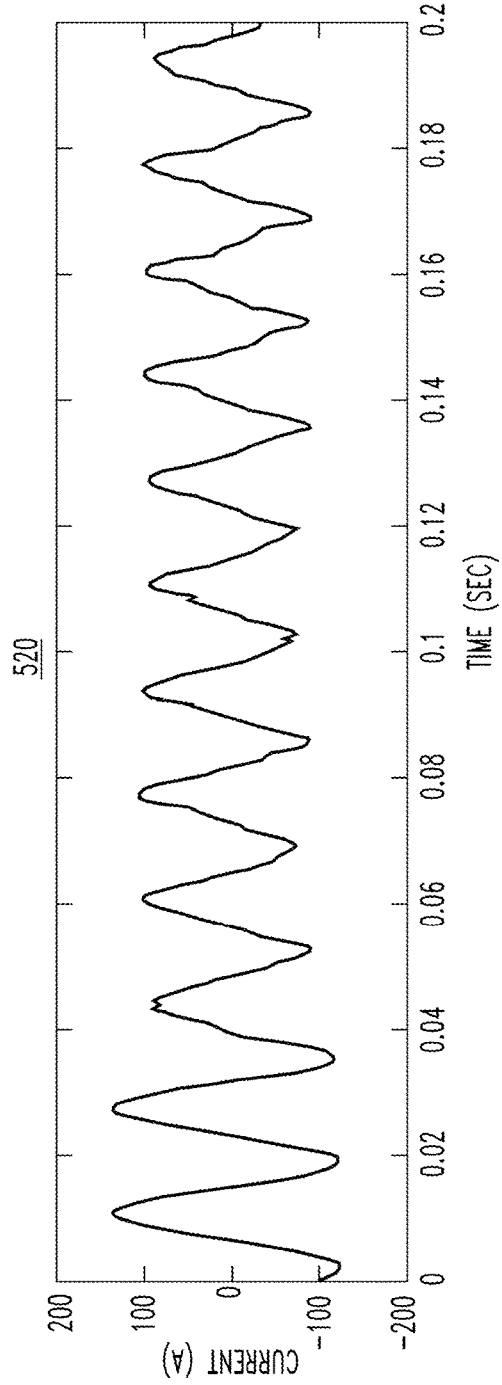

FIG. 7A is an exemplary graph 500 of an input line voltage signal, in accordance with an embodiment of the disclosed concept. Graph 500, for instance, corresponds to a sinusoidal line voltage having a peak voltage of approximately 175 V, which remains true over the testing period. FIG. 7B is an exemplary graph 520 of a circuit current as read, for example, at shunt 124 of FIG. 2B, in accordance with an embodiment of the disclosed concept. In the illustrative, non-limiting embodiment, the current is read through shunt 124, then goes into the arcing sample (e.g., a 5 Amp Carbonized Path Arc), through a resistive load, and back to neutral. Depending on the sensitivity of the load impedance, the amplitude of the current through shunt 124, as shown within graph 520, will vary. Of particular note is that the sensed voltage across shunt 124 through the first 34 milliseconds is substantially sinusoidal and symmetric. Here, the sensed voltage is due to the fact that a load current through shunt 124 is sensed. Using Ohm's Law, the current through shunt 124 is then determined. At approximately time 35 milliseconds, when the arcing is initiated, the current across shunt 124 begins to vary, remaining substantially sinusoidal but less symmetric and consistent. The load current that is sensed corresponds to the measured voltage across shunt 124. This, for example, is due to the Ohm's Law relationship between current, resistance, and voltage.

FIG. 7C is an exemplary graph 540 of the voltage across the arcing sample, in accordance with the disclosed concept. As seen within graph 540, the voltage across the arcing sample begins at approximately 35 milliseconds when the arcing is initiated, and retains a substantially similar profile over time. The profile of the arcing sample, in one embodiment, is a peak including two spikes—one at the beginning of the peak and one at the end. This dual spiked peak is present across the arcing profile seen within graph 540.

FIG. 7D is an exemplary graph 560 of each measured pulse width as a function of time, in accordance with an embodiment of the disclosed concept. FIG. 7E is an exemplary graph 580 of graph 560 having a moving average filter applied thereto, in accordance with an embodiment of the disclosed concept. For example, a seventeen point moving average filter may be applied to graph 560 to generate graph 580. The initial 34 milliseconds of graph 580 correspond to a maximum amplitude period when the input to super regenerative high frequency receiver 104 is not detecting any high frequency noise. When the arc fault event is occurring, for example beginning at approximately 35 milliseconds, the period of the output of super regenerative high frequency receiver 104, as seen within graph 580, begins to reduce, signifying that high frequency noise due to the arc fault event is being detected. Using this over a function of time, the high frequency content of a given noise current frequency is capable of being monitored.

While specific embodiments of the disclosed concept have been described in detail, it will be appreciated by those skilled in the art that various modifications and alternatives to those details could be developed in light of the overall teachings of the disclosure.

Accordingly, the particular arrangements disclosed are meant to be illustrative only and not limiting as to the scope of the disclosed concept which is to be given the full breadth of the claims appended and any and all equivalents thereof.

What is claimed is:

1. An arc fault circuit interrupter ("AFCI") detector system, comprising:
    a current measure component that determines that a frequency of current corresponds to a frequency of interest;
    at least one super regenerative high frequency receiver tuned to the frequency of interest and being structured to receive the current from the current measure component at the frequency of interest as an input and to quench at a rate based on an amplitude of the current at the frequency of interest; and
    at least one microcontroller in communication with the at least one super regenerative high frequency receiver and being structured to determine whether an arc fault is occurring based on the rate of quenches of the at least one super regenerative high frequency receiver.

2. The AFCI detector system of claim 1, wherein the at least one super regenerative high frequency receiver includes an oscillator and a tank circuit, wherein the at least one super regenerative high frequency receiver is structured to provide the current to the oscillator and the tank circuit.

3. The AFCI detector system of claim 1, wherein:
    the at least one super regenerative high frequency receiver comprises a plurality of super regenerative high frequency receivers; and
    each super regenerative high frequency receiver of the plurality of super regenerative high frequency receivers is tuned to a different frequency of interest.

4. The AFCI detector system of claim 1, wherein the current measure component comprises at least one of: a shunt, a current transformer, and a Rogowski coil.

5. The AFCI detector system of claim 1, further comprising:
    a pre-amplifier structured to isolate oscillator noise.

6. The AFCI detector system of claim 1, wherein:
    the current measure component comprises a shunt;
    the current measure component structured such that the shunt is sensitive to current at the frequency of interest; and
    the shunt enables the current to be provided to the at least one super regenerative high frequency receiver based on the frequency of the current corresponding to the frequency of interest.

7. The AFCI detector system of claim 1, wherein the at least one super regenerative high frequency receiver comprises a resonant circuit, the resonant circuit being tuned to a resonant frequency matching the frequency of interest that the current measure component is tuned to.

8. The AFCI detector system of claim 1, wherein the frequency of interest is between approximately 5 MHz and approximately 20 MHz.

9. The AFCI detector system of claim 2, further comprising:
    an amplitude detector circuit that is structured to have a time constant that allows for the oscillations of the tank circuit to dissipate prior to new oscillations restarting.

10. The AFCI detector system of claim 2, further comprising:
    a microprocessor in communication with the tank circuit, wherein the microprocessor is structured to:
        determine that oscillations in the tank circuit have reached a threshold level; and
        cause a digital output signal to be generated to remove current from the tank circuit to allow the oscillations to dampen.

11. The AFCI detector system of claim 2, wherein the at least one microcontroller is further structured such to:
    receive a signal that oscillations in the tank circuit have reached a threshold level; and
    cause a digital output signal to be generated to remove current from the tank circuit to allow the oscillations to dampen.

12. An arc fault circuit interrupter ("AFCI") detector system, comprising:
    a plurality of super regenerative high frequency receivers that are each tuned to a different frequency of interest, wherein each super regenerative high frequency receiver is structured to receive the current at the different frequency of interest corresponding to that super regenerative high frequency receiver to quench at a rate based on an amplitude of the current at the different frequency of interest corresponding to that super regenerative high frequency receiver; and
    at least one microcontroller in communication with the plurality of super regenerative high frequency receivers and being structured to determine whether an arc fault is occurring based on the rate of quenches of one or more of the plurality of super regenerative high frequency receivers.

13. The AFCI detector system of claim 10, wherein the at least one microcontroller comprises a plurality of microcontrollers that are each associated with a super regenerative high frequency receiver of the plurality of super regenerative high frequency receivers.

14. The AFCI detector system of claim 12, further comprising:
- a current measure component that determines that a frequency of the current corresponds to at least one different frequency of interest associated with at least one of the super regenerative high frequency receivers.

15. The AFCI detector system of claim 13, wherein:
the current measure component comprises a plurality of shunts, each shunt of the plurality of shunts being sensitive to current at each different frequency of interest of the plurality of super regenerative high frequency receivers; and
each shunt enables the current to be provided to a corresponding super regenerative high frequency receiver tuned to the different frequency of interest based on the frequency of the current.

16. The AFCI detector system of claim 15, wherein each super regenerative high frequency receiver of the plurality of super regenerative high frequency receivers is tuned such that a resonant circuit of that super regenerative high frequency receiver has a resonant frequency that matches the at least one different frequency of interest of a corresponding shunt of the plurality of shunts.

17. The AFCI detector system of claim 12, further comprising:
- at least one pre-amplifier in communication with at least one super regenerative high frequency receiver, the at least one pre-amplifier being structured to isolate oscillator noise.

18. A method for determining whether an arc fault event is present, the method comprising:
receiving a current at a frequency of interest by at least one super regenerative high frequency receiver tuned to the frequency of interest;
quenching, with the at least one super regenerative high frequency receiver, at a rate based on an amplitude of the current at the frequency of interest;
determining, using at least one microcontroller in communication with the at least one super regenerative high frequency receiver, whether an arc fault is occurring based on the rate of quenches of the at least one super regenerative high frequency receiver.

19. The method of claim 18, further comprising:
tuning, prior to receiving, a resonant frequency of a resonant circuit of the at least one super regenerative high frequency receiver to correspond to the frequency of interest; and
tuning an amplitude detector circuit of the at least one super regenerative high frequency receiver such that the amplitude detector circuit has a time constant that allows for oscillations within the tank circuit to dissipate prior to new oscillations restarting.

20. The method of claim 18, further comprising:
generating, prior to determining the amplitude, a squared digital signal using a detector circuit, wherein the amplitude of the current is inversely logarithmically proportional to the squared digital signal; and
providing the squared digital signal to the at least one microcontroller.

* * * * *